(12) United States Patent
Konuk

(10) Patent No.: US 7,380,189 B2
(45) Date of Patent: May 27, 2008

(54) CIRCUIT FOR PLL-BASED AT-SPEED SCAN TESTING

(75) Inventor: Haluk Konuk, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 742 days.

(21) Appl. No.: 10/868,546

(22) Filed: Jun. 15, 2004

(65) Prior Publication Data

US 2005/0276321 A1    Dec. 15, 2005

(51) Int. Cl.
*G01R 31/28* (2006.01)
(52) U.S. Cl. .................... 714/731; 714/729
(58) Field of Classification Search ............... None
See application file for complete search history.

(56) References Cited

U.S. PATENT DOCUMENTS

| 6,598,192 | B1 * | 7/2003 | McLaurin et al. | 714/726 |
| 6,966,021 | B2 * | 11/2005 | Rajski et al. | 714/726 |
| 7,155,651 | B2 * | 12/2006 | Nadeau-Dostie et al. | 714/731 |

OTHER PUBLICATIONS

"A Novel and Practical Scheme for Inter-Clock At-Speed Testing" by Hiroshi Furukawa This paper appears in: IEEE International Test Conference, 2006. ITC '06. Publication Date: Oct. 2006, pp. 1-10, ISSN: 1089-3539, ISBN: 1-4244-0292-1, INSPEC Accession No: 9297790.*

"PLL based high speed functional testing" by Jayabalan et al. This paper appears in: 12th Asian Test Symposium, 2003. ATS 2003. Publication Date: Nov. 16-19, 2003 on pp. 116-119, ISSN: 1081-7735, ISBN: 0-7695-1951-2, INSPEC Accession No. 7905566.*

N. Tendolkar et al.; Novel Techniques for Achieving High At-Speed Transition Fault Test Coverage for Motorola's Microporcessors Based on Power PC Instruction Set Architecture Proceedings of the IEEE VLSI Test Symposium 2002.

X. Lin et al.; "High-Frequency, At-Speed Scan Testing"; IEEE Design & Test of Computers, Sep.-Oct. 2003; pp. 17-25.

* cited by examiner

*Primary Examiner*—Cynthia Britt
(74) *Attorney, Agent, or Firm*—Garlick Harrison & Markison

(57) ABSTRACT

A scheme for PLL-based at-speed scan testing in which a clock generation circuit is used to generate different clock signals to scannable flip-flops of an integrated circuit. When the integrated circuit is under at-speed scan test mode of operation, the clock generation circuit receives a scan-clock signal to scan in a test vector to the scannable flip-flops during an input shift phase when shifting is enabled and to scan out a resultant vector from the scannable flip-flops during an output shift phase when shifting is also enabled. However, when shifting is not enabled during a capture phase between the two shift phases, the scan-clock signal triggers a 2-pulse circuit to release two pulses during the capture phase of at-speed scan testing. The two pulses from the 2-pulse circuit are based on an internal PLL-based clock signal. The clock generation circuit may be utilized in single or multiple clock domain systems. In a multiple clock domain environment, separate scan-clock signals may be sent to individual clock domains within an integrated circuit and only the domain to be acted on by a test vector has its respective scan-clock pulsed during the capture phase.

11 Claims, 7 Drawing Sheets

CIRCUIT FOR PLL-BASED AT-SPEED SCAN TESTING

BACKGROUND OF THE INVENTION

1. Technical Field of the Invention

The embodiments of the invention relate to scan testing of integrated circuits and, more particularly, to a PLL-based at-speed scan testing scheme.

2. Description of Related Art

Generally, integrated circuits are tested after manufacture to ensure that the integrated circuits are not operationally defective. One testing technique employs the use of scanning vectors, in which a particular test vector is shifted into an integrated circuit (IC) prior to running the IC's combinational logic in its normal mode. A resultant output vector is then read to determine the response of the IC to the scanned in test vector. For high complexity ICs, one popular technique is the use of scannable flip-flops in the IC for scan testing. Some ICs employ full scan techniques, in which all of the flip-flops in the IC design are made scannable. Scannable flip-flops allow a test vector to be shifted in to load the flip-flops with a known pattern. Then, the IC is operated to allow the IC's normal circuitry to respond to the test vector, which response is captured by the flip-flops. Subsequently, the state of the scannable flip-flops are read out to determine the response of the IC to the initial test vector.

In a typical scan operation, a test vector is shifted into the IC by use of a scan clock to set the state of the flip-flops. The same scan clock is also used to scan out the state of the flip-flops after capturing the circuit response to the test vector. Since the scan shifting is performed while the IC is not operating normally, the scan clock may have a much slower clock frequency than the operational clock frequency of the IC. In some modes of testing, the slower scan clock may be adequate to capture the response of the internal circuitry. This technique is sometimes referred to as regular scan or DC scan. However, with much of the highly integrated and faster devices of today, it is typically the practice to employ faster clocks to perform the capture. The use of a faster clock for capture allows testing of the internal circuitry to be performed at normal operating speeds of the IC to more accurately portray the normal operational response of the circuitry. The technique of using a faster clock to capture the response of the IC to scan testing is generally referred to as at-speed scan or AC scan.

Although at-speed scan techniques exist, these known techniques utilize an external signal to indicate when the at-speed testing is to commence. That is, a separate external signal is utilized to initiate the capture of the internal states.

Furthermore, many ICs now employ more than one clock domain on a chip. If two or more clock domains in the IC communicate with one another, then the simultaneous testing of the different domains using scan test vectors may be difficult to achieve, since each vector tests one domain at a time. Specialized register programming may be necessary to specify which clock domains are to capture the at-speed data to an input test vector. However, these techniques present challenges to ICs employing multiple clock domains, where there is communication between the clock domains.

SUMMARY OF THE INVENTION

An apparatus and method in which a clock source is used to generate a higher frequency internal clock signal and a clock generation circuit, coupled to the clock source, is used to generate different clock signals to internal circuitry of an integrated circuit. The integrated circuit includes scannable flip-flops that are used for scan testing when the integrated circuit is placed into a scan test mode. Under normal mode of operation, the clock generation circuit passes the high frequency internal clock signal as a system clock.

In the test mode, the clock generation circuit receives a slower frequency scan-clock signal to scan in a test vector to the scannable flip-flops during a first shift phase when shifting is enabled and to scan out a resultant vector from the scannable flip-flops during a second shift phase when shifting is also enabled. However, when shifting is not enabled during a capture phase between the two shift phases, the clock generation circuit triggers at least two pulses for at-speed scan at the higher frequency, based on the internal clock signal, to capture data by the scannable flip-flops.

In one embodiment, the scan-clock signal triggers a 2-pulse circuit to release two pulses during the capture phase of at-speed scan testing. The two pulses from the 2-pulse circuit are based on the internal clock signal, which is PLL-based in one example, and the two pulses are also synchronized to the internal clock signal.

The clock generation circuit may be utilized in single or multiple clock domain systems. In a multiple clock domain environment, separate scan-clock signals may be sent to individual clock domains within an integrated circuit and only the domain(s) to be acted on by a test vector have its/their respective scan-clock(s) pulsed during the capture phase.

DETAILED DESCRIPTION OF THE EMBODIMENTS OF THE INVENTION

The embodiments of the present invention may be practiced in a variety of settings that scan testing is used. It may be used in integrated circuits having single clock domains or multiple clock domains. Generally, it is understood that some form of software tool, such as an Automatic Test Pattern Generation (ATPG) tool, is used to generate the test vectors. These test vectors include the test signal inputs and expected response from the integrated circuit. These test vectors are typically applied to the integrated circuit using Automatic Test Equipment (ATE). Furthermore, much of the discussion centers on at-speed scan testing, since this technique involves more complexity. However, regular scan techniques may be employed as well for scan testing an integrated circuit. Additionally, the description below discusses operations of various circuitry using signal states, such as activating on high. It is to be noted that equivalent circuits may be designed with other states performing the function, such as activating on low.

Figure 1:
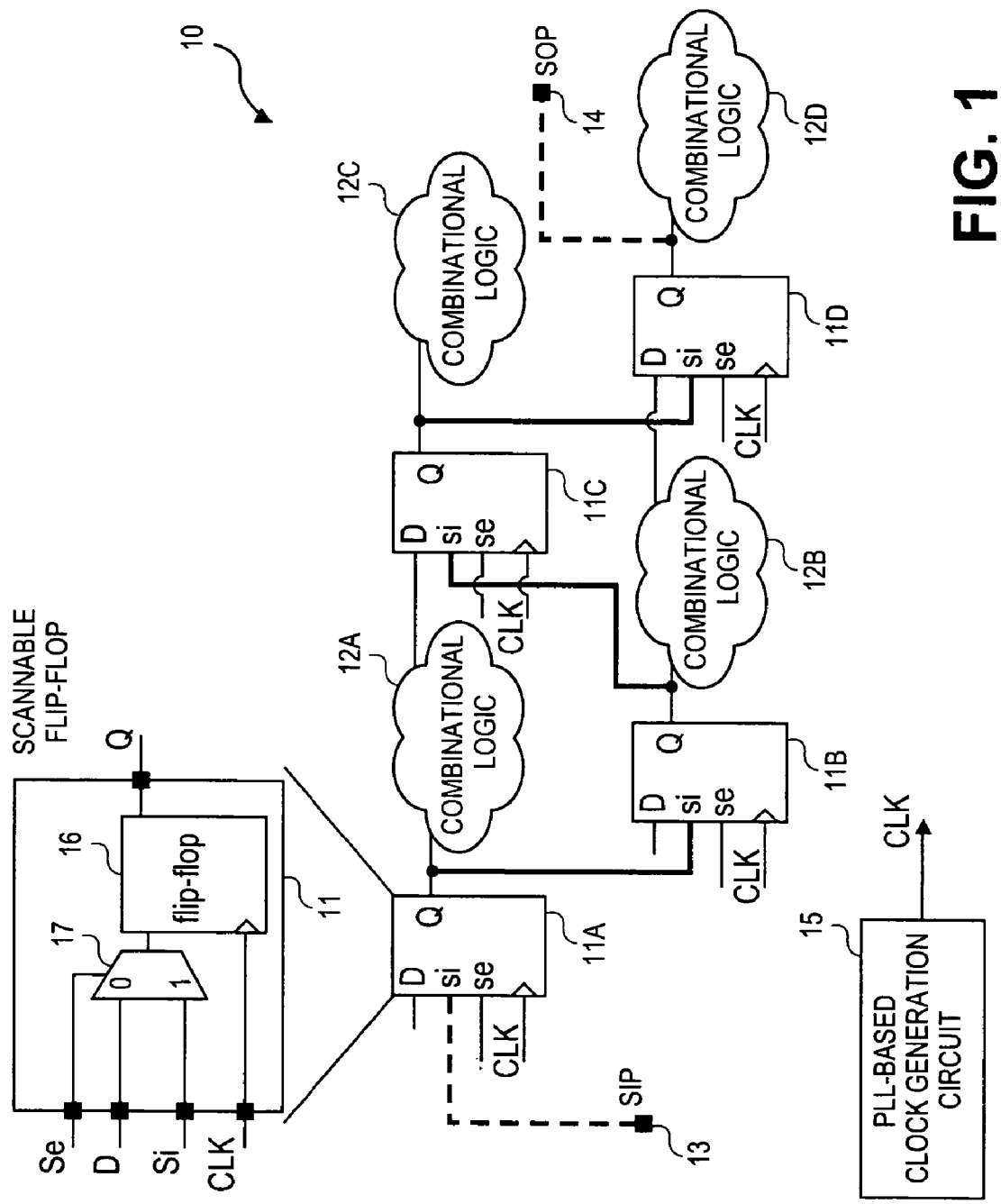
FIG. 1 is a block schematic diagram of a portion of an integrated circuit showing a scan chain of scannable flip-flops and a PLL-based clock generation circuit used to provide a clock signal to the scan chain.

FIG. 1 shows an example scan chain 10 comprised of scannable flip-flops 11A, 11B, 11C and 11D (collectively hereafter referred to as flip-flops 11). Only four flip-flops are shown in the example, but it is noted that scan chains may comprise many such flip-flops. Scan chain 10 is part of an integrated circuit (IC) that may have multiple scan chains of same or differing length. In one embodiment, flip-flops 11 are D-type latches that latch the input D to its output Q in response to a transition of a clock signal CLK at its clock input (>). Scannable flip-flops 11 also receive two other inputs, noted as scan-in (Si) and shift-enable (Se).

Operation of scannable flip-flop 11 is shown in more detail in the enlargement of flip-flop 11A. Generally, scannable flip-flop 11 is a regular flip-flop which selects between two inputs, D and Si. The shift-enable signal is used as a select signal to multiplexer (mux) 17 to select between the D input and the Si input. When the shift-enable signal Se is low, indicating a normal operation of the IC, regular input D is selected as input to flip-flop 16. However, when shifting is enabled (Se is high), the scan-in signal Si is selected as input to flip-flop 16.

In scan chain 10, flip-flops 11A-D are coupled (chained) having the Q output of a flip-flop coupled to the Si input of the next flip-flop in the chain. The Q output of the flip-flop is shown also coupled to respective combinational logic circuitry 12A-D (collectively hereafter referred to as combinational logic 12). Combinational logic 12 represent circuitry that is used during normal operation of the IC. The combinational logic 12 output is coupled to the D input of a scannable flip-flop. In the example of FIG. 1, Q output of flip-flop 11A is coupled to the Si input of flip-flop 11B and to combinational logic 12A, which output is then coupled to the D input of flip-flop 11C. The other connections are noted in FIG. 1. It is noted that the various flip-flops are present in the IC to perform their intended function in the IC. Making the flip-flops scannable by coupling a particular Q output to an Si input of another flip-flop, sets up a scannable test chain which path is shown in bold in FIG. 1.

Furthermore, the first flip-flop of the chain (flip-flop 11A) receives its Si input from an ATE. Typically, this input is provided to a scan-in pin (or port) 13, labeled SIP in FIG. 1, which may be a terminal pin of the IC. Likewise, the last flip-flop in the chain (flip-flop 11D) also sends its Q output to a scan-out terminal pin (or port), which may also be sent to the ATE for comparison to the expected response.

For the example chain 10, when the IC is operating normally (Se is low), the D input is selected for latching, so that the combinational logics 12 are in the signal path. However, when scan is enabled (Se is high), the Si input is selected, by-passing the combinational logic 12.

Also shown in FIG. 1 is a clock generation circuit 15, which is typically a Phase Locked Loop (PLL)-based clock signal. However, the clock generation need not necessarily be limited to PLL-based clock signals. The clock signal CLK from clock generation circuit 15 is coupled to the various flip-flops to clock the flip-flops for their latching operation. As will be noted below, one embodiment for implementing the clock generation circuit 15 will be described in reference to FIG. 4.

Figure 2:
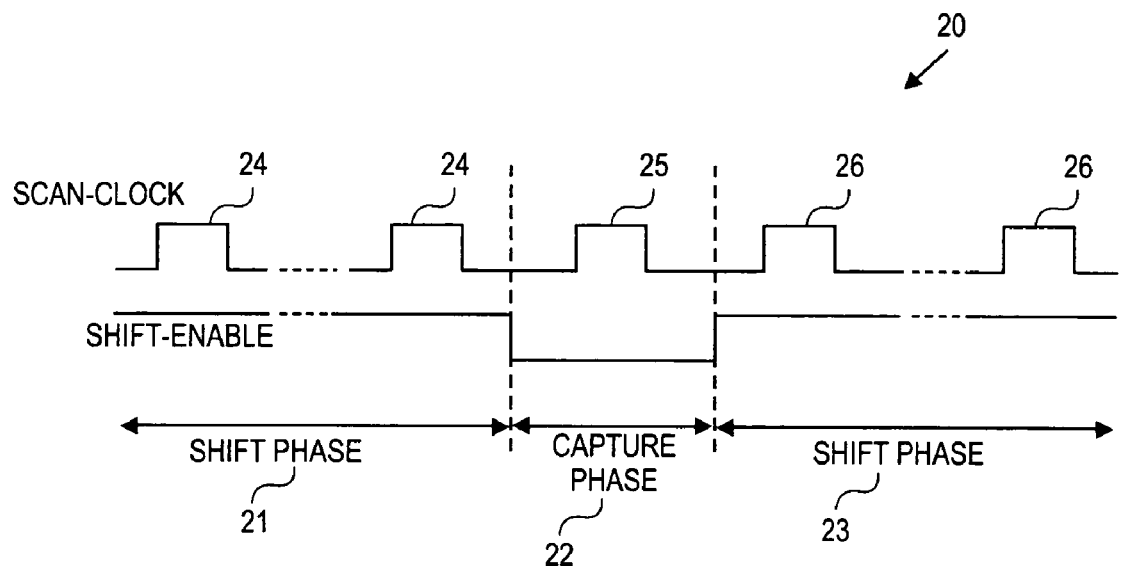
FIG. 2 is a scan test waveform diagram to perform a regular scan, in which a scan clock signal is used for both shift phase and capture phase portions of the scan testing.

FIG. 2 illustrates a timing diagram when a regular scan is performed on scan chain 10. Timing diagram 20 illustrates three phases for performing a scan test to a scan chain (such as scan chain 10 of FIG. 1) of an IC. A first shift phase 21 is used to input the scan test vector to the flip-flops of the scan chain. Capture phase 22 is used to capture the response of the circuits of the IC to the test vector. Finally, a second shift phase 23 is used to scan the resultant vector out of the flip-flops. Timing diagram 20 shows a scan-clock signal and a shift-enable signal. The shift-enable signal is a global signal to the IC and is input to the Se input of the scannable flip-flops 11 of FIG. 1. The scan-clock pulses 24 during the first shift phase 21 are used to shift in the test vector into the flip-flops, when shift-enable signal is high. In one embodiment, a vector introduced at the SIP input of scan chain 10 is shifted into flip-flops 11 following the bold path shown in FIG. 1 with the occurrence of each rising edge of pulse 24 until the vector values are latched into the flip-flops.

After the input vector shifting is finished, the shift-enable signal goes low to allow the flip-flops to select their regular data inputs D. When regular scan is used, a single pulse 25 of the scan-clock is used to capture the response of the combinational logic (such as combinational logic 12) of the IC to the previously loaded test vector. A single rising edge is typically adequate to capture the response of the combinational logic and latch the result through the following flip-flop. In a typical regular scan operation, the scan-clock pulse may be used to provide the capture pulse 25. After the one capture pulse, shift-enable signal is set high again to initiate shift phase 23 by placing the flip-flops into the scan mode, at which point scan-clock pulses 26 shift the state of the flip-flops out of the IC as a resultant output vector to read the response of the IC to the input test vector.

Figure 3:
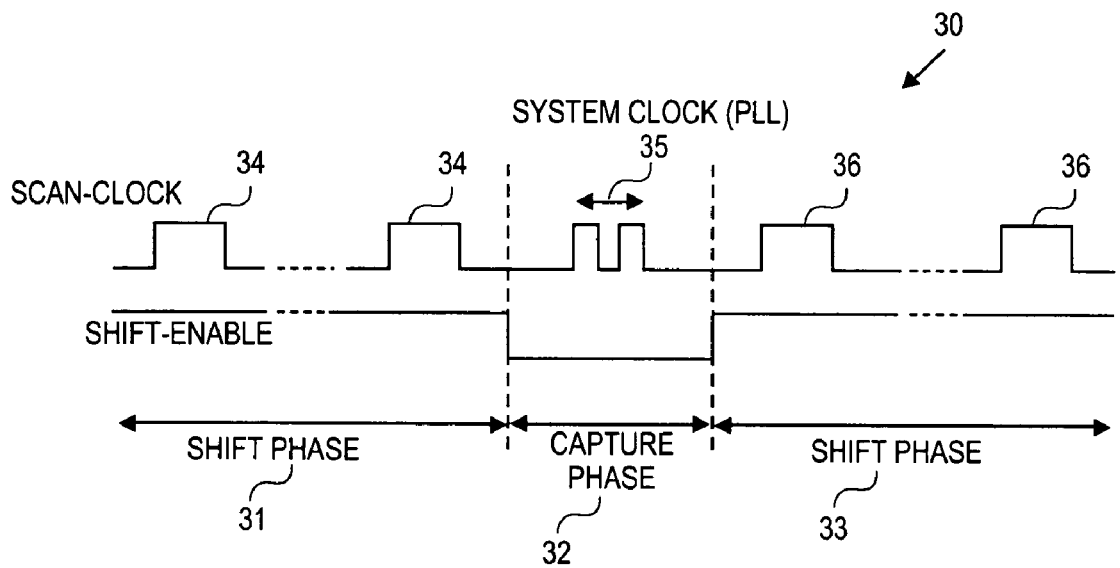
FIG. 3 is a scan test waveform diagram to perform at-speed scan, in which a scan clock signal is used for the shift phase portions but a PLL-based clock signal is used for the capture phase portion of the scan testing.

FIG. 3 illustrates a timing diagram 30 when at-speed scan is performed on scan chain 10. Input vector shift phase 31, capture phase 32 and resultant output vector shift phase 33 are equivalent to respective phases 21-23 of FIG. 2. However, with the at-speed scan, a faster clock is used during the capture phase 32. As noted in diagram 30, a faster clock signal 35 is utilized during the capture phase so that the circuitry responds at a clock speed approximately near that of the clock frequency at normal operation. In one embodiment of practicing the invention, an actual system clock signal, which is typically generated from a PLL, is used to generate the capture pulses 35. Although other embodiments may have one, two or more pulses occurring during the capture phase of at-speed scan testing, in the described embodiment, two clock pulses are generated during capture phase 32. The first rising edge of the capture pulses is used to clock the input vector through the combinational logic, while the second rising edge is used to latch the response vector through the flip-flops following the respective combinational circuit.

As noted in FIG. 1, clock generation circuit 15 is used to generate the clock signal CLK to the scannable flip-flops of the IC. Although the clock generation circuit 15 may be external to the IC, typically, circuit 15 is included as part of the IC. In the particular embodiment, clock generation circuit 15 is PLL-based, in which the PLL is used to provide the system clock. Other embodiments may base the system clock on circuitry that is not PLL-based. The clock generation circuit 15 is capable of adjusting the CLK signal depending on the mode of operation (normal or test) and phase of the test scan. Although a variety of clock circuits may be employed for the clock generation circuit 15, one embodiment is shown in FIG. 4.

Figure 4:
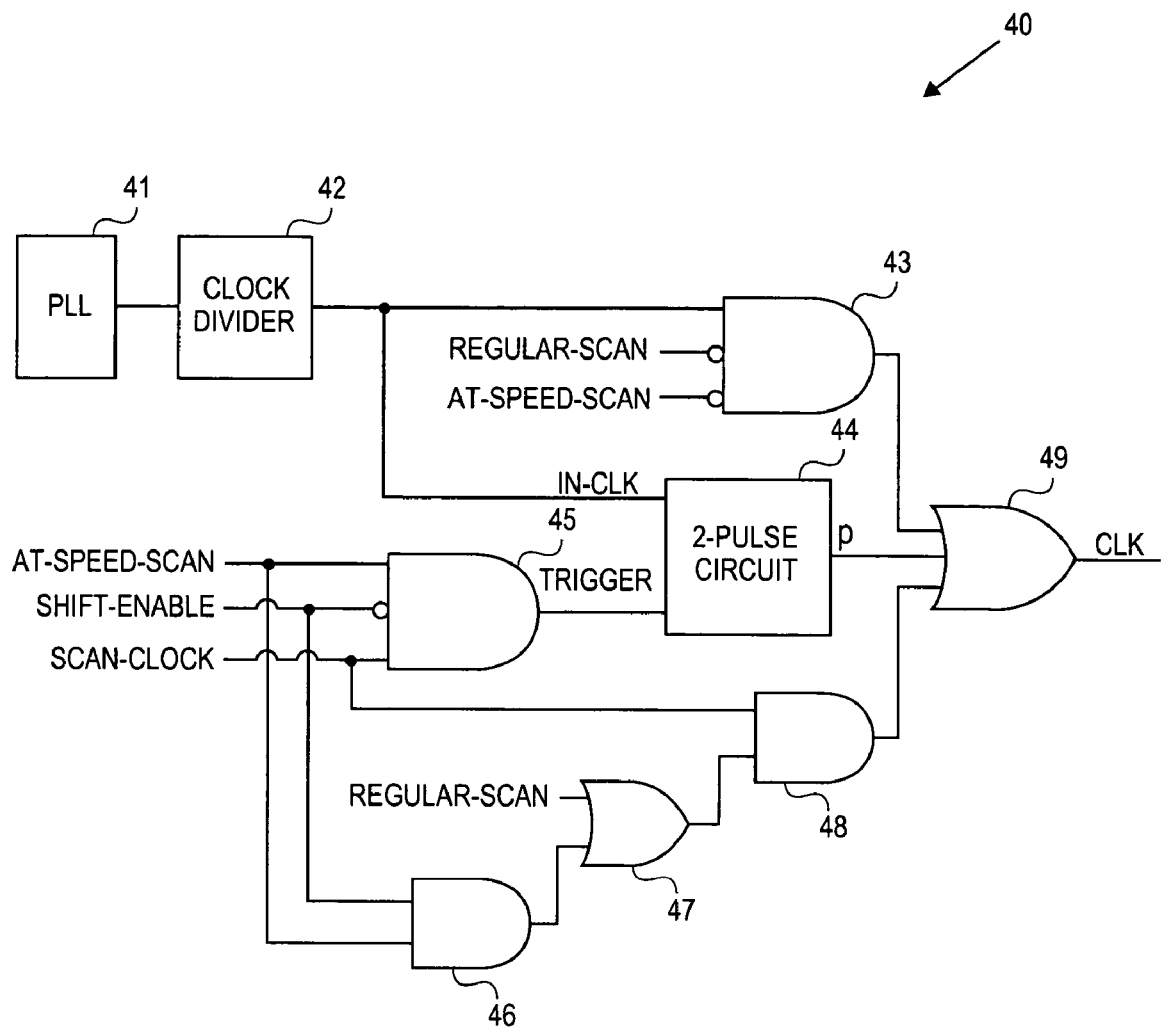
FIG. 4 is a circuit schematic diagram showing one embodiment clock circuit for implementing the clock generation circuit of FIG. 1.

Referring to FIG. 4, a clock circuit 40 is shown to generate the clock signal CLK. Clock circuit 40 may be included within clock generation circuit 15 of FIG. 1. Clock circuit 40 is designed to receive four signals, which typically are external signals (driven by the ATE). The four signals used for practicing this particular embodiment are regular-scan, at-speed-scan, shift-enable and scan-clock. The regular-scan signal and at-speed-scan signal are used to indicate the type of test scan to be performed. In the particular embodiment, a high state of the regular-scan signal indicates a regular scan test operation and high state of the at-speed-scan signal indicates an at-speed scan test operation. The two signals are never both high at the same time. In normal (non-test) mode of operation, both the regular-scan and at-speed-scan signals are in the low state.

The shift-enable signal is used to indicate when the vectors are being shifted into or out of the scannable flip-flops. In the example embodiment, high state of the shift-enable signal indicates the shifting phases of the test scan and this same shift-enable signal is globally coupled to the scannable flip-flops at their Se input to select the Si input. The scan-clock signal is a clocking signal, which is used 1) to shift the scan chain during the shift in and shift out phases of the scan test; 2) as the capture phase clock during regular scan testing; and 3) as a gating signal to generate fast pulses during the capture phase of at-speed scan testing. As noted above, scan-clock is typically much slower in speed than the system clock.

A PLL 41 generates a high frequency clocking signal which is to be used as the system clock or one of the system clocks. The output from PLL 41 is coupled through a clock divider 42. It is to be noted that such clock dividers may not be used in other embodiments. The output of clock divider 42 is referred to as in-clk (internal clock). Furthermore, although only one output is shown, other embodiments may employ clock trees to generate multiple clock outputs.

The remaining circuitry is comprised of various logic to provide three different clock inputs to an output logic gate 49. The output of logic gate 49 provides one of its clock signal input as its output. This output from logic gate 49 is the CLK signal to the circuits of the IC, including the scannable flip-flops.

The first logic section, comprised of logic gate 43, allows the system clock signal from the PLL 41 to be sent to output logic gate 49 during normal operation of the IC. The second logic section, comprised of logic gates 46, 47, 48, allows the scan-clock signal to be sent to output logic gate 49 during the two shift phases, as well as during the capture phase if the scan test to be performed is the regular scan. The third logic section, comprised of logic gate 45 and a 2-pulse circuitry 44, allows two pulses of the PLL in-clock signal to be sent to output logic gate 49 during the capture phase if the scan test to be performed is at-speed scan.

In the particular embodiment, logic gate 43 is an AND gate having the regular-scan signal and at-speed-scan signal as inputs through an inverter. The in-clk signal from clock divider 42 is also coupled as input. Accordingly, under normal mode of operation, the PLL in-clk signal is coupled to output gate 49, since the two scan signals are low. However, when either the regular-scan or at-speed scan is invoked, the output of AND gate 43 is low.

The shown embodiment for the second logic section is comprised of AND gate 46, OR gate 47 and gate 48. The at-speed-scan signal and shift-enable signal are coupled as inputs to AND gate 46. The regular-scan signal and output from AND gate 46 are coupled as inputs to OR gate 47. The output of OR gate 47 and the scan-clock signal are coupled as inputs to AND gate 48. The output of AND gate 48 is coupled to OR gate 49. Whenever, regular scan is invoked as the scan test mode, the "1" state of the regular-scan signal at OR gate 47 allows AND gate 48 to pass the scan-clock through to output OR gate 49 during both shift phases and the capture phase. If the test mode invoked is the at-speed scan, AND gate 46 output has a "1" state only when the shift-enable signal is high ("1" state), so that the scan-clock is passed through gate 48 only during the vector shift in and shift out phases of the at-speed scan. During the capture phase of the at-speed scan, the output from AND gate 48 is low ("0" state), since the shift-enable signal is "0". During normal mode of operation, the output of AND gate 48 is also "0".

The third logic section for the embodiment is comprised of AND gate 45 and 2-pulse circuit 44. The at-speed-scan signal, the shift-enable signal (through an inverter) and the scan-clock signal are coupled as input to gate 45. The output of AND gate 45 is labeled trigger, since this signal triggers the activation of 2-pulse circuit 44. AND gate 45 couples the scan-clock signal as the trigger signal when in the at-speed scan mode (at-speed-scan is "1") and the shift-enable signals is "0". At any other time, the trigger signal is "0". If the test tool is set to allow one pulse of the scan-clock to occur during the capture phase by controlling the duration of the shift-enable signal being low, then one trigger pulse is generated at the output of AND gate 45 to trigger the 2-pulse circuitry 44. As will be noted in reference to FIG. 6, the trigger provided to circuit 44 allows 2 pulses of the in-clk signal to be generated at the output of circuit 44. This output is noted as "p". Accordingly, during the capture phase of the at-speed scan test, two PLL-based pulses are passed to the output OR gate 49. At other times, output "p" is "0". In other embodiments, two or more (or at least two) at-speed pulses may be pulsed.

Figure 5:
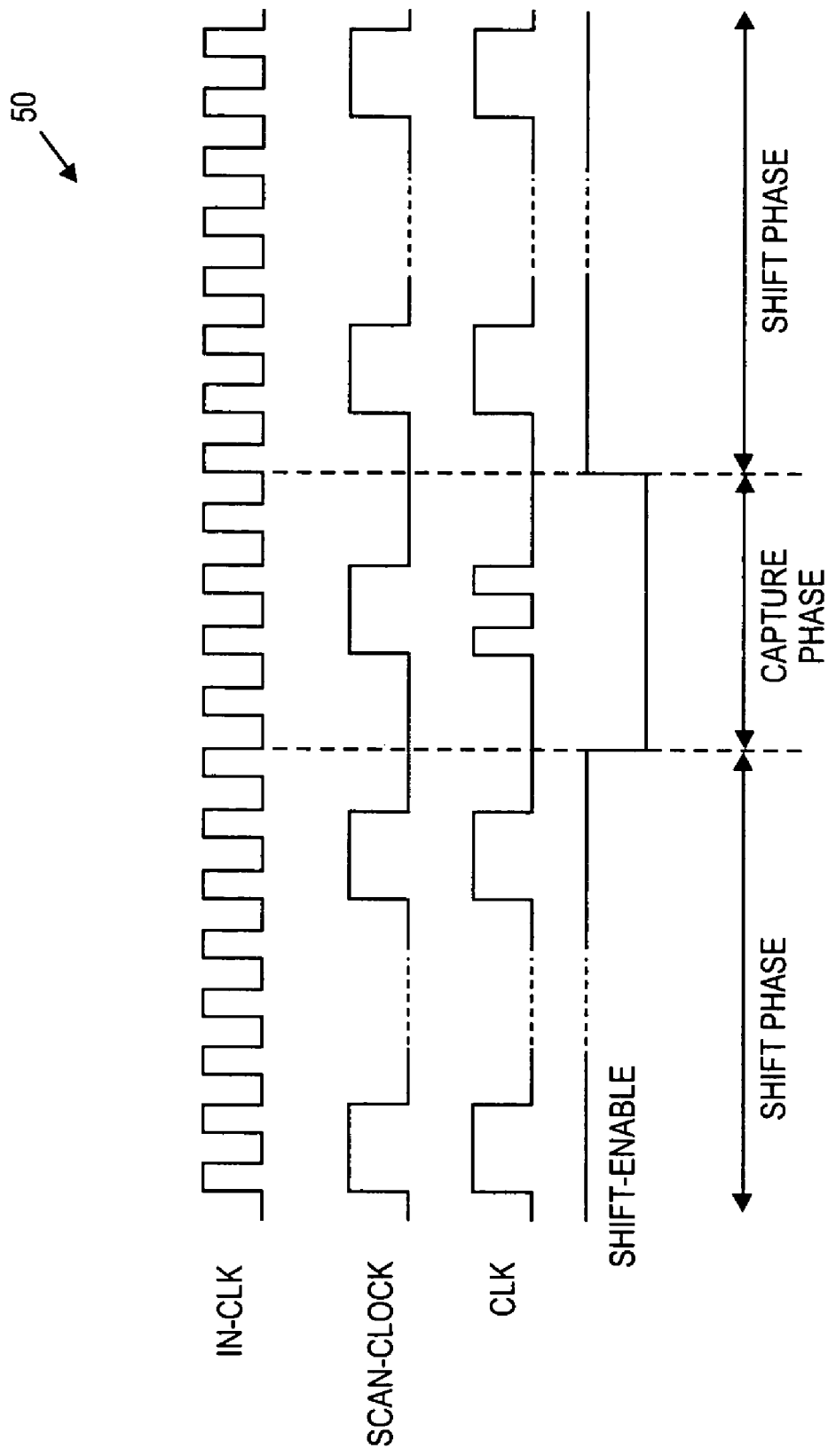
FIG. 5 is a waveform diagram of the circuit shown in FIG. 4 when at-speed scan is used in the capture phase.

FIG. 5 shows a timing diagram 50 that illustrates the occurrence of the two pulses at the PLL frequency during the capture phase of at-speed scan test. It is to be noted that if the test being invoked is the regular-scan test, then the two at-speed pulses in the capture phase would be replaced with the single slower scan-clock pulse in diagram 50.

Figure 6:
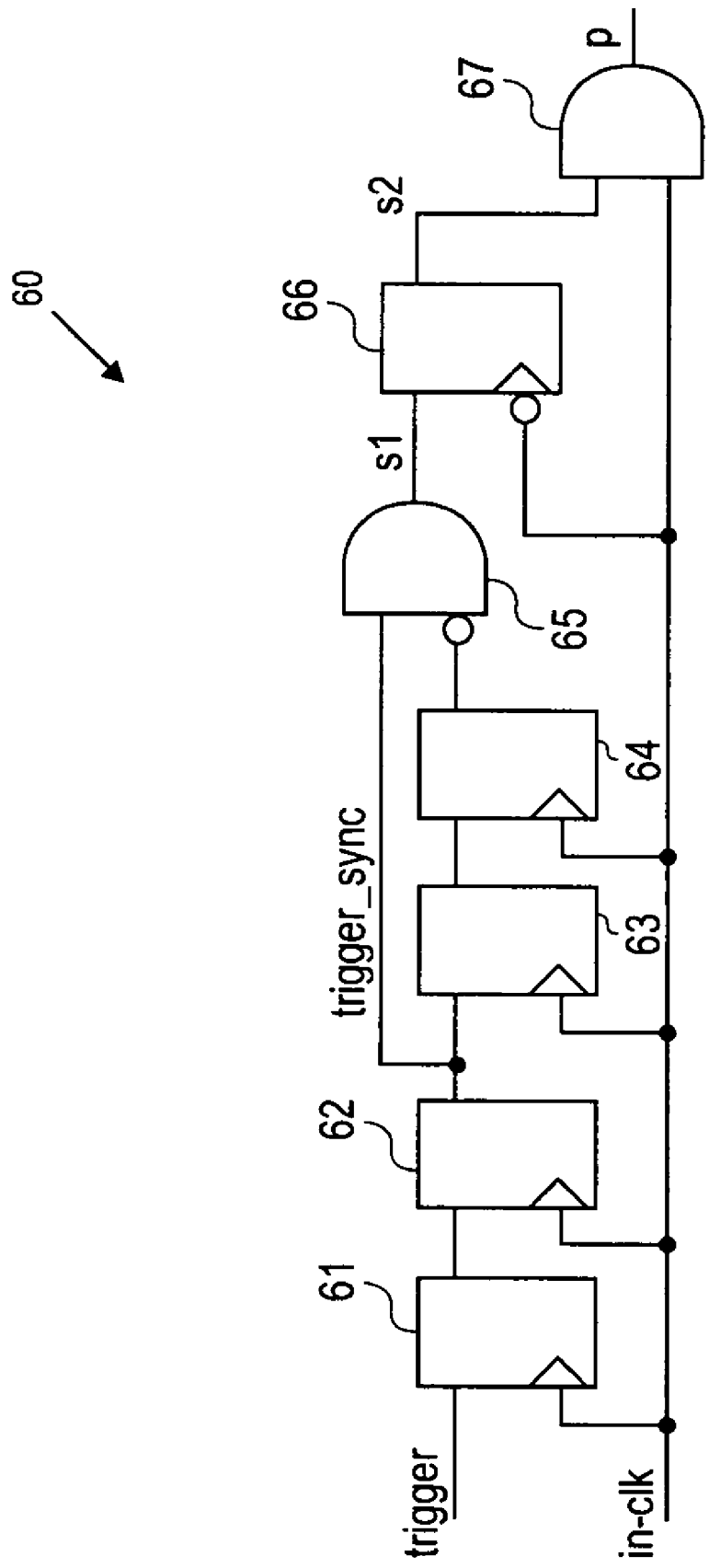
FIG. 6 is a circuit schematic diagram showing one embodiment for implementing the 2-pulse circuitry of FIG. 4.
Figure 7:
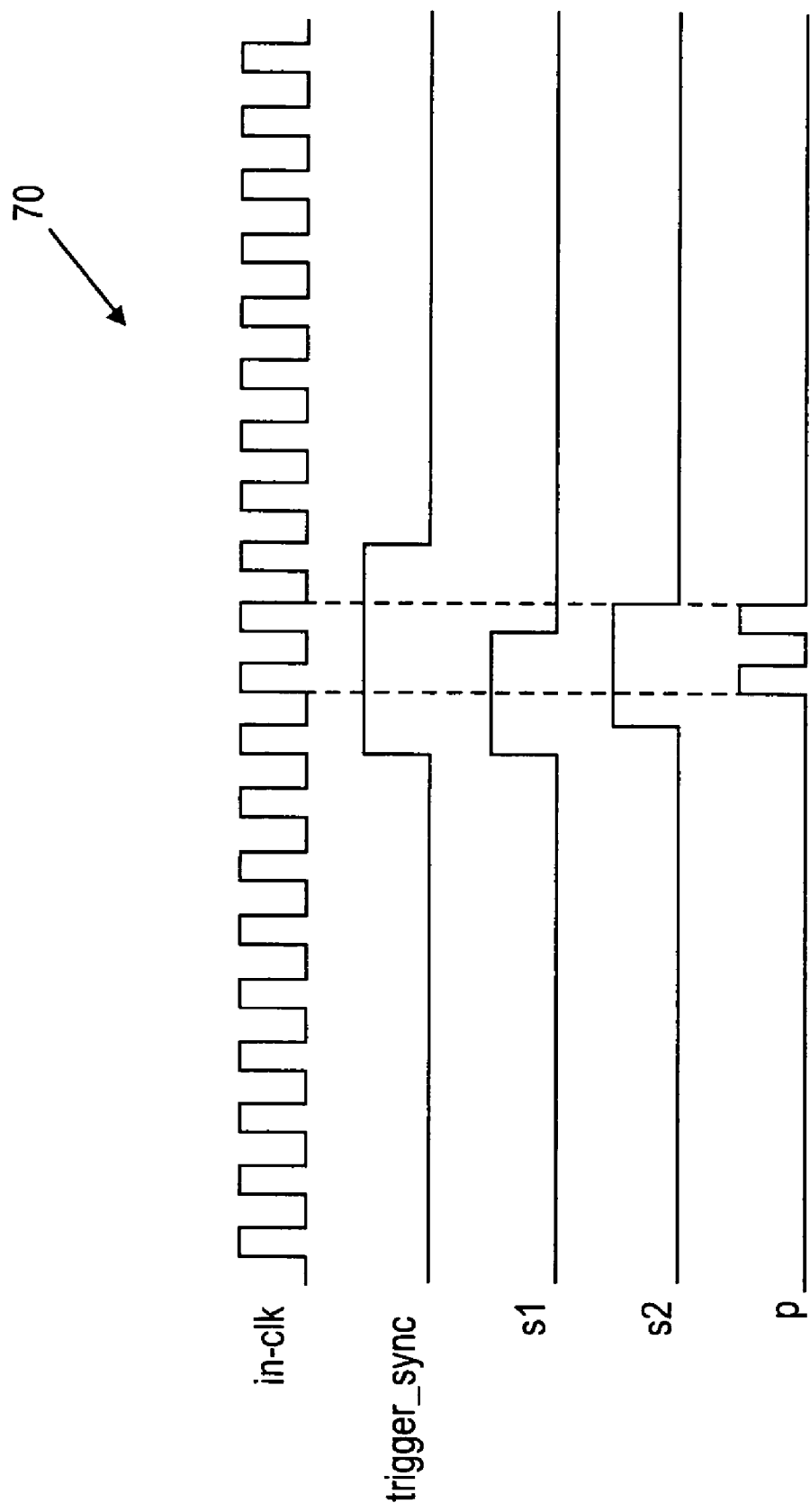
FIG. 7 is a waveform diagram illustrating the operation of the 2-pulse circuitry shown in FIG. 6 when at-speed scan is used.

FIG. 6 shows one embodiment of a circuit 60 for implementing the 2-pulse circuit 44 of FIG. 4 and the accompanying timing diagram is shown as diagram 70 in FIG. 7. It is to be noted that various other circuits may be implemented to provide equivalent function as circuit 60 to release two clock pulses (or at least two at-speed clock pulses) as output "p", whenever there is a trigger signal. The trigger to initiate the two capture phase pulses is the rising edge of the trigger signal in the example embodiment of FIG. 4. Since the trigger signal rises as a result of the rising edge of the scan-clock signal and since the scan-clock signal typically comes from an external source which is not synchronized to the in-clk signal, the trigger is basically an asynchronous signal with respect to the in-clk signal.

Therefore, in order to synchronize the two signals, flip-flops 61 and 62 are used to synchronize the trigger signal to the timing of the in-clk signal. The trigger signal is input to flip-flop 61 and then latched through flip-flop 62. The in-clk signal clocks flip-flops 61, 62, as well as flip-flops 63, 64, 66. The synchronizing flip-flops 61, 62 eliminate metastability that might occur when the rising edge of the trigger signal violates the set-up or hold time of flip-flop 61. Thus, the output of flip-flop 62 is the synchronized trigger, which is noted as trigger_sync in FIG. 6. The trigger_sync signal is coupled to an input of AND gate 65. After transitioning through two flip-flops 63, 64, the trigger_sync signal is also coupled to an inverted input of AND gate 65 to generate signal "s1" at the output of AND gate 65. Signal "s1" is input to another flip-flop 66, which output is noted as "s2". Flip-flop 66 is clocked by the inverse of the in-clk signal. The in-clk signal and the "s2" signal are coupled as inputs to AND gate 67 and the output of AND gate 67 is the signal "p" out of the 2-pulse circuit 40 of FIG. 4.

As shown by diagram 70, when the trigger_sync signal rises, it enables the release of 2 pulses from the in-clk pulse stream to generate signal "p". In this particular embodiment, a requirement is that the trigger needs to stay high for at least two in-clk periods after trigger rises. The trigger may fall back to 0 at any time after the generation of the two pulses "p".

As noted above, the clock generation circuit of the described embodiments allow for the generation of the clock signal CLK to various circuitry of the IC. For the scannable flip-flops, the CLK signal changes depending on whether the IC is operating in the normal mode or the scan test mode. Furthermore, CLK also changes during the capture phase of the test mode, depending on whether regular scan or at-speed scan is being used. When at-speed scan testing is being utilized, two pulses which are synchronized to the system PLL clock, are generated during the at-speed capture phase. It is to be noted that the at-speed scan capture clock pulses are generated internally, without the use of a separate external signal to indicate the start and/or end of the at-speed scan testing, which may save chip area and which may also simplify the automatic test vector generation process using an ATPG tool.

Figure 8:
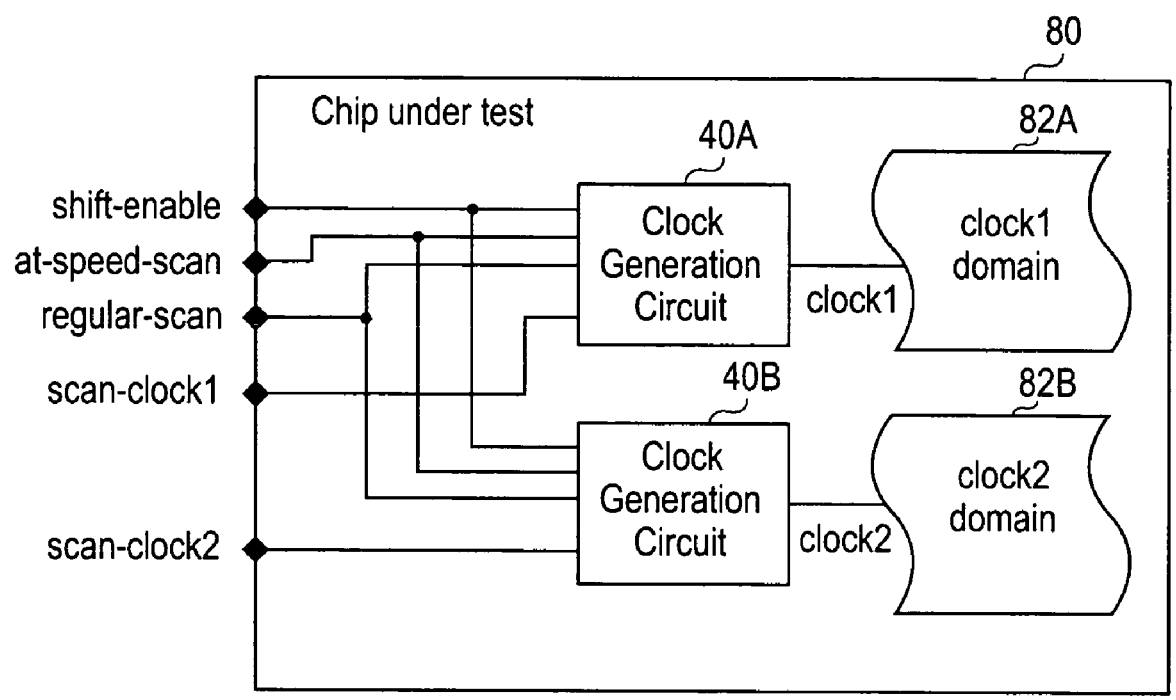
FIG. 8 is a block schematic diagram of an example chip under test when more than one clock domains are present.

FIG. 8 shows an example IC 80 having more than one clock domain within the IC. Separate clock domains are noted as clock1 domain 82A and clock2 domain 82B. Although only two clock domains are noted in IC 80, other embodiments may include more than 2 such clock domains within IC 80. It is to be noted that having multiple clock domains are now common place in many ICs. Furthermore, as complete systems are integrated onto a single IC "chip" there is now a tendency for the different clock domains to communicate with one another. For example, a chip integrating a processor (or multiple processors), memory and input/output (I/O) interfaces, may have separate clock domains for each. These different clock domains may communicate with each other. In such situations, testing of multiple domains simultaneously using scan test vectors may be difficult to achieve, since tools allow each vector to test just one of these domains at a time. That is, only one of these domains capture data during the capture phase.

A practice of an embodiment of the invention, as shown in FIG. 8 allows at-speed testing in a multiple clock domain environment. As shown, a separate clock generation circuit is used for the different clock domains. Thus, clock generation circuit 40A is used with clock domain 82A and clock generation circuit 40B is used with clock domain 82B, for the two clock domain environment of IC 80. Additional such clock generation circuits may be used if there were additional clock domains. Clock generation circuits 40A, 40B are equivalent to circuit 40 of FIG. 4 in one embodiment.

As with circuit 40, an internal PLL is associated with each of the clock domains. In some embodiments, there may just be one PLL with a clock tree to generate the clocks to the various clock generation circuit 40A-B. The shift-enable signal, regular-scan signal and at-speed scan signal are coupled to the individual clock generation circuits 40A-B. However, now there are multiple inputs of the scan-clock signal. As shown, scan-clock1 signal is coupled to circuit 40A and scan-clock2 is coupled to circuit 40B. This allows separate scan-clock signals to be input to respective clock generation circuits. When circuit 40 is used for circuits 40A-B, the scan-clock input to the circuit of FIG. 4 is now replaced by scan-clock1 or scan-clock2, depending on the clock domain 82A-B.

In a multiple clock domain environment, if a given clock domain is not to capture data for a particular scan vector, then the scan-clock signal for that domain is not pulsed during the capture phase. Thus, the same scan test vector may be input to various circuits, including those in other clock domains, but if data is to be captured in only one domain, then the scan-clock(s) for the other domain(s) is/are not pulsed during the capture phase. Only the domain (or domains) where data capture is to occur is (are) pulsed during the capture phase. The procedure is easy to implement from an ATPG tool and no internal register programming is required.

Thus, scheme for PLL-based at-speed scan testing is described. The embodiments of the invention may implemented in a single clock domain device or a multiple clock domain device, in which certain advantages noted above apply in multiple clock domain environments.

I claim:

1. An apparatus comprising:

a plurality of scannable flip-flops resident on an integrated circuit (IC);

a clock source internal to the IC generate a system clock signal for the IC; and a clock generation circuit coupled to the clock source and to the scannable flip-flops to clock the scannable flip-flops, the clock generation circuit also coupled to receive from an external test source a regular scan signal to activate a regular scan mode, at-speed scan signal to activate an at-speed scan mode, shift enable signal to identify a shift phase and a capture phase and a scan clock signal which is lower in frequency than the system clock signal, in which the clock generation circuit is operable to:

(a) couple the system clock signal to clock the scannable flip-flops for operation of the scannable flip-flops to transfer data during a normal mode of operation for the IC;

(b) couple the scan clock signal to clock the scannable flip-flops for both the shift phase and capture phase of the shift enable signal when the regular scan signal indicates that the IC is placed in the regular scan mode, wherein the scan clock signal shifts in a test vector to the scannable flip-flops, captures a response and then shifts out a resultant vector from the scannable flip-flops; and (c) couple the scan clock signal to clock the scannable flip-flops for only the shift phase of the shift enable signal when the at-speed scan signal indicates that the IC is placed in the at-speed scan mode, and couple at least two pulses of the system clock signal to the scannable flip-flops for the capture phase of the shift enable signal, wherein the scan clock signal shifts in a test vector to the scannable flip-flops and shifts out a resultant vector from the scannable flip-flops, but at least two pulses of the system clock signal is used to capture a response from the scannable flip-flops.

2. The apparatus of claim 1, wherein the clock generation circuit is to trigger the at least two pulses when a state change of the scan clock signal is detected during the capture phase of the at-speed mode.

3. The apparatus of claim 2, wherein the clock generation circuit includes a 2-pulse circuit to couple exactly 2 pulses of the system clock signal during the capture phase of the at-speed scan mode.

4. The apparatus of claim 1, wherein the internal clock source is a phase locked loop (PLL)-based clock source.

5. A method comprising:
coupling test signals to an integrated circuit (IC) to test circuitry resident on the IC, the test signals including a regular scan signal to activate a regular scan mode, at-speed scan signal to activate an at-speed scan mode, shift enable signal to identify a shift phase and a capture phase and a scan clock signal which is lower in frequency than a system clock signal generated by the IC, in which the system clock signal is used to clock scannable flip-flops resident on the IC to transfer data during a normal mode of operation for the IC;
scanning in a test vector to the scannable flip-flops by clocking the scannable flip-flops using the scan clock signal during a first shift phase of the shift enable signal;
capturing results of the scanned in test vector in the scannable flip-flops during a capture phase of the shift enable signal by clocking the scannable flip-flops using the scan clock signal if the regular scan signal has activated the regular scan mode, and clocking the scannable flip-flops using at least two pulses of the system clock signal if the at-speed signal has activated the at-speed mode; and
scanning out a resultant vector from the scannable flip-flops during a second shift phase of the shift enable signal by clocking the scannable flip-flops using the scan clock signal.

6. The method of claim 5 further including using the scan clock signal to trigger the at least two pulses of the system clock signal during the capture phase when in the at-speed mode of testing.

7. The method of claim 6 further including synchronizing the at least two pulses to a phase locked loop (PLL)-based system clock signal.

8. An integrated circuit comprising:
a plurality of clock domains in which at least two clock domains have different clocks clocked by respective system clock signals;
a phase locked loop (PLL)-based clock source to generate one or more of the system clock signals; and
for each domain:
a plurality of scannable flip-flops; and
a clock generation circuit coupled to the clock source and to the scannable flip-flops, the clock generation circuit coupled to receive from an external test source a regular scan signal to activate a regular scan mode, an at-speed-scan signal to activate an at-speed scan mode, a shift-enable signal to identify a shift phase and a capture phase and a scan clock signal which is lower in frequency than the system clock signal, in which the clock generation circuit is operable to:
(a) couple the system clock signal to clock the scannable flip-flops for operation of the scannable flip-flops to transfer data during a normal mode of operation for the IC:
(b) couple the scan clock signal to clock the scannable flip-flops for both the shift phase and capture phase of the shift enable signal when the regular scan signal indicates that the IC is placed in the regular scan mode, wherein the scan clock signal shifts in a test vector to the scannable flip-flops, captures a response and then shifts out a resultant vector from the scannable flip-flops; and
(c) couple the scan clock signal to clock the scannable flip-flops for only the shift phase of the shift enable signal when the at-speed scan signal indicates that the IC is placed in the at-speed scan mode, and couple at least two pulses of the system clock signal to the scannable flip-flops for the capture phase of the shift enable signal, wherein the scan clock signal shifts in a test vector to the scannable flip-flops and shifts out a resultant vector from the scannable flip-flops, but at least two pulses of the system clock signal is used to capture a response from the scannable flip-flops.

9. The integrated circuit of claim 8, wherein the clock generation circuit for individual domains is to receive a respective scan clock signal and when a vector is not intended for a particular domain, the scan clock for the particular domain is not pulsed during the capture phase.

10. The integrated circuit of 9, wherein the shift enable signal, regular scan signal and at-speed scan signals are global to the plurality of clock domains, but the scan clock signal is local to the clock generation circuits of the different domains.

11. The integrated circuit of claim 10, wherein the individual clock domains are to generate their own respective PLL-based internal clock signal for their respective clock domains.

* * * * *

UNITED STATES PATENT AND TRADEMARK OFFICE
CERTIFICATE OF CORRECTION

| | | |
|---|---|---|
| PATENT NO. | : 7,380,189 B2 | Page 1 of 1 |
| APPLICATION NO. | : 10/868546 | |
| DATED | : May 27, 2008 | |
| INVENTOR(S) | : Haluk Konuk | |

It is certified that error appears in the above-identified patent and that said Letters Patent is hereby corrected as shown below:

Column 10, line 14, in Claim 8: replace "IC:" with --IC;--.

Signed and Sealed this

Twenty-fourth Day of March, 2009

JOHN DOLL
*Acting Director of the United States Patent and Trademark Office*